United States Patent [19]
Kumar

[11] Patent Number: 5,629,638
[45] Date of Patent: May 13, 1997

[54] ADAPTIVE THRESHOLD VOLTAGE CMOS CIRCUITS

[75] Inventor: Rajendra Kumar, Sunnyvale, Calif.

[73] Assignee: Hewlett-Packard Company, Palo Alto, Calif.

[21] Appl. No.: 542,235

[22] Filed: Oct. 12, 1995

Related U.S. Application Data

[63] Continuation of Ser. No. 153,937, Nov. 17, 1993, abandoned.

[51] Int. Cl.$^6$ .................... H03K 19/0948; H03K 19/017
[52] U.S. Cl. .............................. 326/121; 326/17; 326/83
[58] Field of Search .................................. 307/443, 475, 307/451, 448; 326/121, 83, 86, 17, 21, 112, 119, 117, 120; 327/544

[56] References Cited

U.S. PATENT DOCUMENTS

| | | | |
|---|---|---|---|
| 4,250,406 | 2/1981 | Alaspa | 377/79 |
| 4,463,273 | 7/1984 | Dingwall et al. | 326/120 |
| 4,489,246 | 12/1984 | Nishiuchi | 307/448 |
| 4,558,234 | 12/1985 | Suzuki et al. | 307/446 |
| 4,595,845 | 6/1986 | Briggs | 326/121 |
| 4,612,461 | 9/1986 | Sood | 307/475 |
| 4,808,854 | 2/1989 | Reinagel | 307/451 |
| 4,956,691 | 9/1990 | Culley et al. | 357/41 |
| 5,017,811 | 5/1991 | Worley | 307/475 |
| 5,034,628 | 7/1991 | Matsuzawa et al. | 326/109 |
| 5,057,715 | 10/1991 | Larsen et al. | 307/451 |
| 5,132,567 | 7/1992 | Puri et al. | 307/446 |
| 5,150,186 | 9/1992 | Pinney et al. | 357/42 |
| 5,200,921 | 4/1993 | Okajima | 307/451 |

FOREIGN PATENT DOCUMENTS 0470716  2/1992  European Pat. Off. ........ H01L 21/82

OTHER PUBLICATIONS

"Threshold–Controlled CMOS–Chips for Low–Power Low–Voltage Applications", IBM Technical Disclosure Bulletin, vol. 36, No. 1, Jan. 1993, pp. 345–347.

"Asymmetric CMOS Logic Gates", IBM Technical Disclosure Bulletin, vol. 32, No. 2, Jul. 1989, pp. 421–422.

Cherkauer, Brian S., and Friedman, Eby G., "The Effects of Channel Width Tapering on the Power Dissipation of Serially Connected MOSFETs", IEEE International Symposium on Circuits and Systems, vol. 3, May 1993, pp. 2110–2113.

Oyamatsu et al., "Design Methodology of Deep Submicron CMOS Devices for 1V Operation", 1993 Symposium on VLSI Technology, pp. 89–90.

Kitsukawa et al., "WP 3.4: 256Mb DRAM Technologies for File Applications", ISSCC 93/Session3/Non–Volatile, Dynamic, and Experimental Memories/Paper WP 3.4, 1993 IEEE International Solid State Circuits Conference, pp. 48–49.

Shimohigashi et al., "Low Voltage ULSI Design—The Lower, The Better—", 1992 Symposium on VLSI Circuits Digest of Technical Papers, Jun. 4–6, 1992, Seattle Washington, pp. 54–58.

Martin Gold, "IEEE confab eyes 2–V future", Electronic Engineering Times, Oct. 11, 1993, p. 16.

*Primary Examiner*—Edward P. Westin
*Assistant Examiner*—Jon Santamauro

[57] ABSTRACT

A CMOS circuit in which the threshold voltage of at least one MOS transistor of the CMOS circuit is altered is disclosed. By altering the threshold voltage the speed/power dissipation tradeoff can be modified to match the design criteria of a particular CMOS circuit. For example, to increase the pull-up speed of the PMOS transistor in the CMOS transistor pair of a CMOS circuit, the threshold voltage of selective MOS transistors is lowered. The altering can occur on a device level or a circuit level. A method for designing such CMOS logic circuits is also disclosed.

8 Claims, 9 Drawing Sheets

FIG. 3 (INVERTER)

FIG. 4 (NAND)

ADAPTIVE THRESHOLD VOLTAGE CMOS CIRCUITS

CROSS REFERENCE TO RELATED APPLICATION

This is a continuation of application Ser. No. 08/153,937 filed on Nov. 17, 1993, now abandoned.

The present application is related to copending application Ser. No. 07/975,491, filed Nov. 12, 1992, and entitled "NCMOS—A High Performance Logic Circuit". This application is hereby incorporated by reference.

BACKGROUND OF THE INVENTION

1. Field of the Invention

The present invention relates to CMOS integrated circuits and, more particularly, to CMOS circuits which can adapt their speed/power dissipation tradeoff to design conditions.

2. Description of the Related Art

In recent years complementary metal-oxide semiconductors (CMOS) technology has been widely used for VLSI design. The advantage of CMOS technology is that it has very low power dissipation in comparison with other technologies such as bipolar devices. The disadvantage of CMOS technology is that its performance is slow compared to bipolar devices.

As a result of this disadvantage of CMOS technology, BiCMOS technology was developed. BiCMOS technology largely retains the low power dissipation of CMOS technology, yet performs with the high speed of bipolar devices. However, the BiCMOS solution is considerably more complex to fabricate because of the presence of the bipolar devices.

Another problem of BiCMOS technology is that the scalability of this technology at supply voltages of 2 volts or less is a problem. Today, supply voltages of 5 volts and 3.3 volts are most common, but it is thought that the supply voltage could eventually drop to about 1 volt. Hence, the high speed and relatively low power dissipation of BiCMOS is not likely to be available for supply voltages below 2 volts. One attempted solution to the scalability problem of BiCMOS is found in U.S. Pat. No. 5,132,567 which discloses a BiCMOS NAND circuit that apparently provides improved scalability by employing low threshold n-channel FET transistors in conjunction with standard threshold n and p channel FET transistors. The resulting BiCMOS NAND circuit is even more complex to fabricate than conventional BiCMOS.

It is known that higher drive current and faster performance can be obtained by making the cell size of MOS transistors on an integrated circuit larger. However, although increasing the cell size improves switching performance of the given cell, it also undesirabiliy increases the input gate capacitance of the cell which slows the driving of this cell, and requires additional die area which limits chip density.

Conventionally, in the design of integrated circuits, the threshold voltages of the MOS transistors are intentionally made the same magnitude. A threshold voltage is the voltage required to put the transistor in a conductive state. It is defined as that gate-to-source voltage below which only leakage current flows. The threshold voltage of a transistor is controlled or determined by the doping profile of its gate-channel. Typically, with silicon transistors, the threshold voltage is about 0.7 volts. If the source of the transistor is not grounded, the threshold voltage is also effected by the voltage applied to the source voltage. This is known as the body effect of a field effect transistor.

It has recently become known that an entire integrated circuit can be constructed using low threshold voltages for its MOS transistors. See Kitsukawa, "256Mb DRAM Technologies for File Applications", IEEE International Solid-State Circuits Conference, February 1993. The use of low threshold voltages enables the integrated circuit to operate at high speed. The disadvantage with using all low threshold MOS transistors is that power dissipation substantially increases.

Only in a few isolated special situations have MOS transistors with distinctly different threshold voltages have been intentionally placed on the same integrated circuit. For example, U.S. Pat. No. 5,150,186 discloses a CMOS output circuit which adds a zero threshold transistor to an otherwise conventional CMOS transistor pair to prevent damage to the PMOS transistor when high voltages are applied to the output node. U.S. Pat. No. 5,150,186 discloses a similar CMOS driver for the same or similar purpose. These designs are merely protection mechanisms that not only do not improve switching performance of the CMOS circuit but also consume greater die area.

Thus, there is a need for a technology that can provide high speed operation and low power dissipation over a wide range of supply voltages extending approximately from 1 to 6 volts. The technology should support high density circuit designs without significantly complicating the fabrication process.

SUMMARY OF THE INVENTION

Broadly speaking, the invention pertains to a CMOS circuit in which the threshold voltage of at least one MOS transistor of the CMOS circuit is altered to modify the speed/power dissipation tradeoff. Namely, to increase the switching performance of the CMOS circuit, the threshold voltage of selective MOS transistors is altered.

The invention can be implemented as an apparatus or a method. As an apparatus, the invention can be implemented at a device level or a circuit level. In either case, the MOS transistors with the altered thresholds can relate to discrete transistors, discrete logic circuits, or integrated circuits (including application specific integrated circuits (ASIC), programmable logic arrays (PLA), gate arrays, standard cells, or custom integrated circuits (IC)). As a method, the invention can be implemented as a method for designing CMOS logic circuits. Various illustrative embodiments of the invention are described below.

According to a first embodiment of the invention, a CMOS transistor pair (one PMOS and NMOS transistor) of a CMOS circuit is fabricated such that the PMOS transistor has a first threshold voltage and the NMOS transistor has a second threshold voltage which is different in magnitude from the first threshold voltage. For example, in the CMOS transistor pair, the threshold voltage of the PMOS transistor can be lowered to improve pull-up performance, while the threshold voltage of the NMOS transistor remains at the standard threshold voltage. Alternatively, or in addition thereto, the threshold voltage of the NMOS transistor can be lowered to improve pull-down performance.

According to a second embodiment of the invention, an integrated CMOS circuit uses multiple threshold voltages to achieve a desired speed/power dissipation tradeoff. The integrated CMOS circuit includes a plurality of low threshold voltage PMOS transistors, a plurality of standard threshold old PMOS transistors, and a plurality of standard threshold NMOS transistors. The low threshold voltage PMOS transistors are selectively utilized when increased speed is needed and additional power dissipation can be tolerated. The integrated CMOS circuit may further include a plurality of low threshold voltage NMOS transistors.

According to a third embodiment of the invention, a novel circuit design method for designing a CMOS circuit is able to selectively control threshold voltages to obtain a desired speed/power dissipation performance. The method includes the steps of: identifying a logic element for forming a portion of the circuit; determining whether the logic element is within a speed critical path; selecting a low threshold voltage construction of the logic element when it is determined that the logic element is within a speed critical path; selecting a normal threshold voltage construction of the logic element when it is determined that the logic element is not within a speed critical path; and repeating the above steps for other logic elements forming the remaining portions of the circuit.

In the above embodiments, when a power supply voltage (which is coupled to the CMOS circuit) is equal or above about 2 volts, the low threshold voltage of the MOS transistors is within the range of about 0.1–0.3 volts and the standard (or normal) threshold voltage of the MOS transistors is within the range of about 0.4–1.0 volts. On the other hand, when the supply voltage is below about 2 volts, the standard threshold of the MOS transistors is within the range of about 0.1–0.2 volts which is already relatively low; hence, the altered threshold is increased (instead of lowered) to about 0.3–0.4 volts. In this low voltage operation, the speed/power dissipation is controlled by using the higher threshold voltage MOS transistors where slower speed can be tolerated, thereby decreasing power dissipation of the CMOS circuit.

One advantage of the invention is that it enables the performance characteristics of CMOS technology to closely approach those of BiCMOS. Another advantage of the invention is that it facilitates the designing not only the logic of CMOS circuits but also the speed/power dissipation characteristics of the CMOS circuits. That is, the invention allows the speed/power dissipation to be controllable by the circuit designer. Other advantages will be apparent from the drawings and detailed description.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

Embodiments of the invention are discussed below with reference to FIGS. 1–12. However, those skilled in the art will readily appreciate that the detailed description given herein with respect to these figures is for explanatory purposes as the invention extends beyond these limited embodiments.

Figure 1:
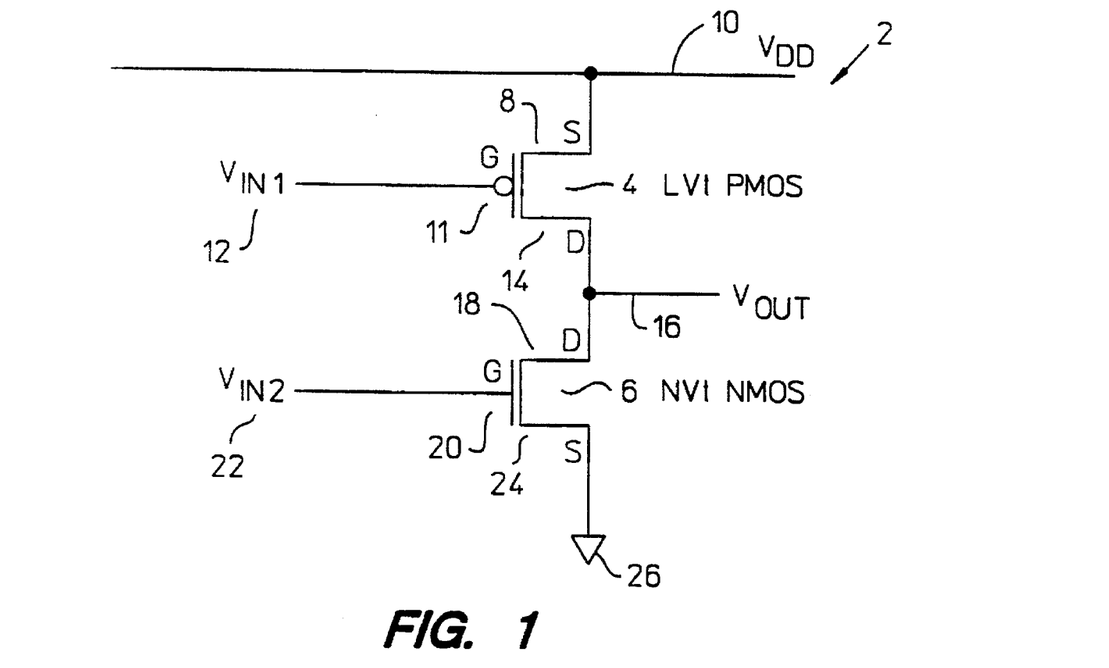
FIG. 1 is a schematic diagram of a, first embodiment of the invention.

FIG. 1 is a schematic diagram of a CMOS circuit 2 according to a first embodiment of the invention. The CMOS circuit 2 includes a low threshold voltage (LVt) PMOS transistor 4 and a normal or standard threshold voltage (NVt) NMOS transistor 6. The LVt PMOS transistor 4 has a source terminal 8 which connects to a power supply terminal 10 ($V_{DD}$), a gate terminal 11 which receives a first input signal 12 ($V_{IN1}$), and a drain terminal 14 connected to an output terminal 16 ($V_{OUT}$). The NVt NMOS transistor 6 has a drain terminal 18 connected to the output terminal 16 ($V_{OUT}$), a gate terminal 20 which receives a second input signal 22 ($V_{IN2}$), and a source terminal 24 which connects to a ground terminal 26.

The logical operation of the CMOS: circuit 2 according to the first embodiment is basically the same as known CMOS circuits which intentionally make the threshold voltages of the PMOS and NMOS transistors nearly the same. Typically, the threshold voltages of the PMOS and NMOS transistors are about 15% of the supply voltage. For example, with a 5 volt supply voltage, the standard or normal threshold voltage would be about 0.7 volts. The low threshold voltage for the PMOS and NMOS transistors is about 5% of the supply voltage. Namely, the magnitude of the low threshold voltage is within the range of 0.1 to 0.3 volts. As an example, the normal voltage threshold could be −0.7 volts for PMOS and +0.7 volts for NMOS.

The benefit provided by the first embodiment is improved speed performance or faster pull-up of the output terminal 16 as compared with convention CMOS. In particular, by using a low Vt in the PMOS transistor 4, a higher drive current is obtained. Thus, according to the invention, by lowering the Vt of some or all the transistors in CMOS circuits, the desirable performance/loss characteristics of BiCMOS circuits can be closely matched without the manufacturing complexities associated with the bipolar devices.

Figure 2:
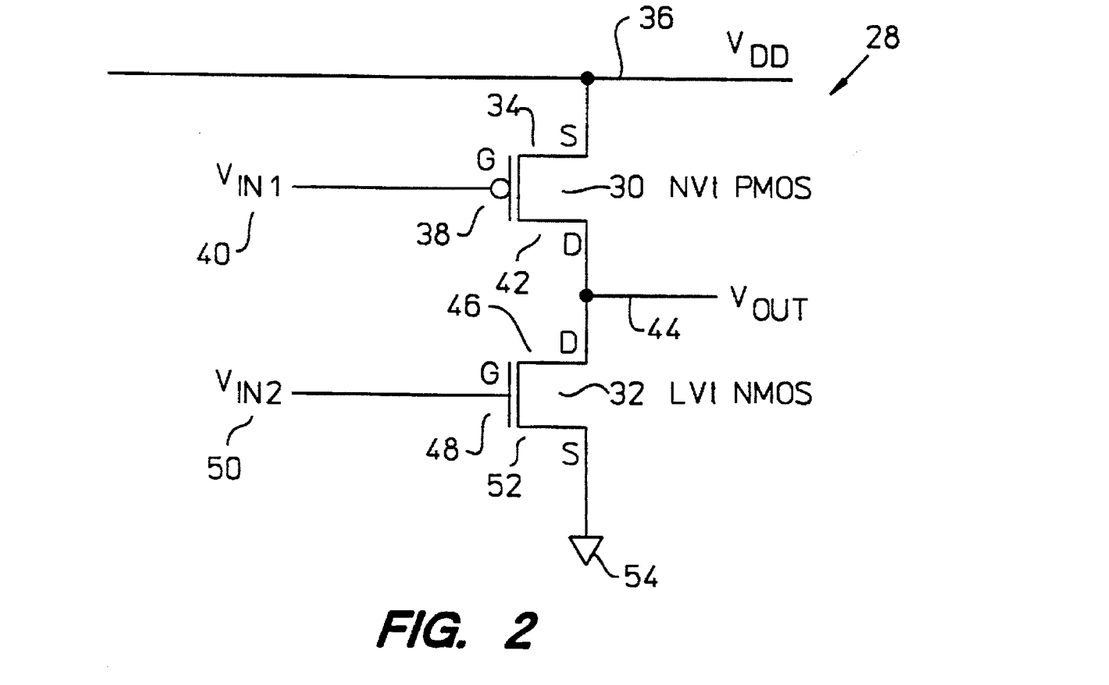
FIG. 2 is a schematic diagram of a second embodiment of the invention.

FIG. 2 is a schematic diagram of a CMOS circuit 28 according to a second embodiment of the invention. The CMOS circuit 28 includes a normal or standard threshold voltage (NVt) PMOS transistor 30 and a low threshold voltage (LVt) NMOS transistor 32. The NVt PMOS transistor 30 has a source terminal 34 which connects toga power supply terminal 36 ($V_{DD}$), a gate terminal 38 which receives a first input signal 40 ($V_{IN1}$), and a drain terminal 42 connected to an output terminal 44 ($V_{OUT}$). The LVt NMOS transistor 32 has a drain terminal 46 connected to the output terminal 44 ($V_{OUT}$), a gate terminal 48 which receives a second input signal 50 ($V_{IN2}$), and a source terminal 52 which connects to a ground terminal 54.

The CMOS circuit 28 according to the second embodiment has improved speed performance, namely faster pull-down of the output terminal 44, as compared with convention CMOS. In particular, by using a low Vt in the NMOS transistor 32, a higher pull-down current is obtained.

Figure 12:
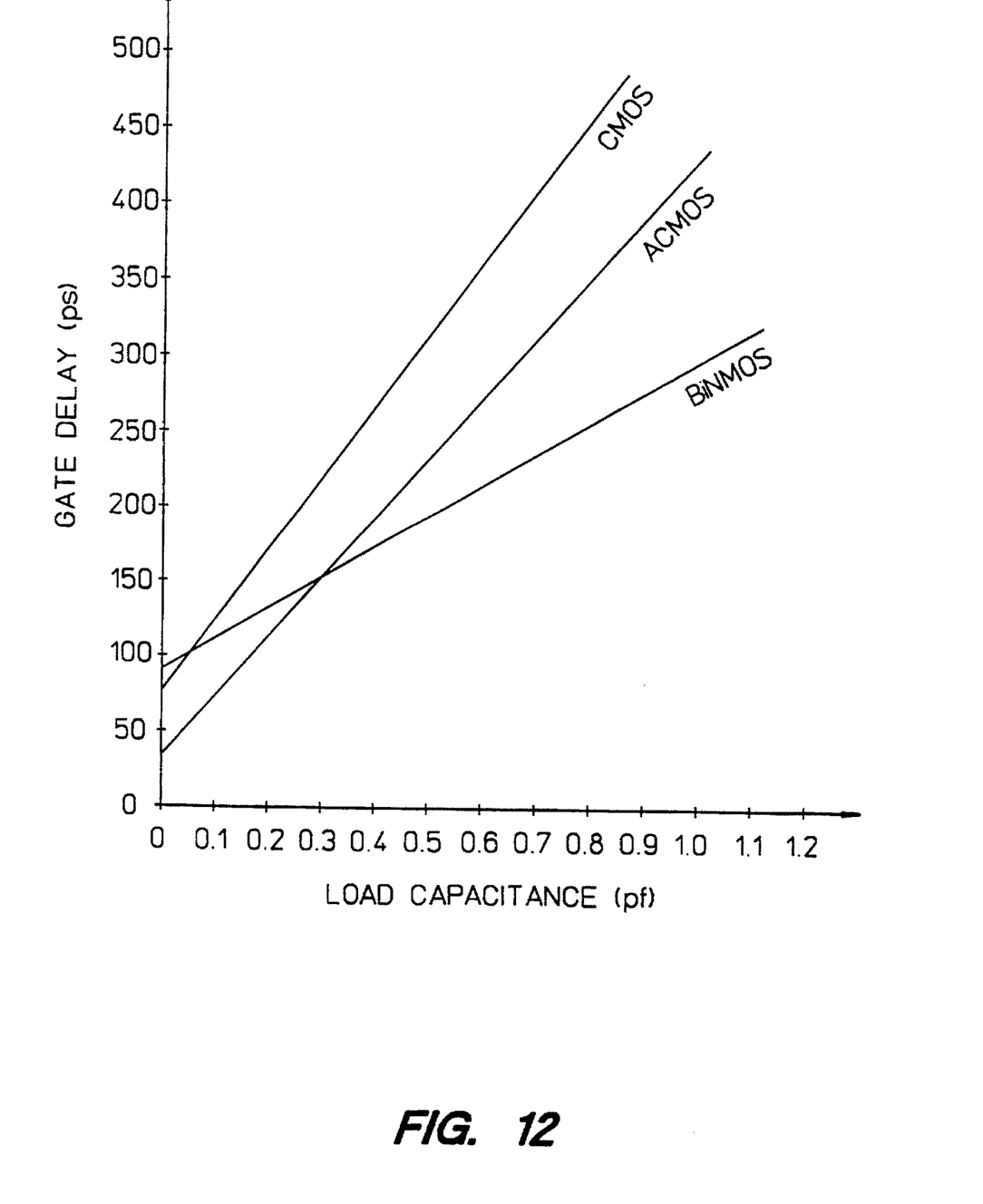
FIG. 12 is a chart illustrating the performance advantage of the invention.

The lowering of the Vt does, however, increase the subthreshold leakage which increases power dissipation. Thus, by selectively lowering the Vt of some of the transistors of in CMOS circuits in accordance with the invention, the desirable performance/loss characteristics of BiCMOS circuits can be closely matched without the manufacturing complexities associated with the bipolar devices. FIG. 12, discussed below, is a graph illustrating the performance of the invention in comparison to regular CMOS and BiNMOS.

Furthermore, since only some of the MOS transistors of a CMOS logic circuit are selectively lowered, the speed performance of the CMOS circuit can be improved while minimizing the resulting increase in power dissipation.

The sealability of the CMOS circuits according to the invention is also much better than BiCMOS circuits. BiCMOS circuits can only be scaled down to about 2 volts. The present invention, on the other hand, can scale down to at least 1 volt. The embodiments are particularly scalable because the output is either pulled-up to a rail or pulled-down to a rail, irrespective of $V_{DD}$.

The fabrication of the CMOS circuits according to the invention is only slightly more complicated than that required for conventional CMOS circuits. In particular, two extra implant steps are required for the channel implant of the two low Vt devices (one implant for each device).

Figure 3:
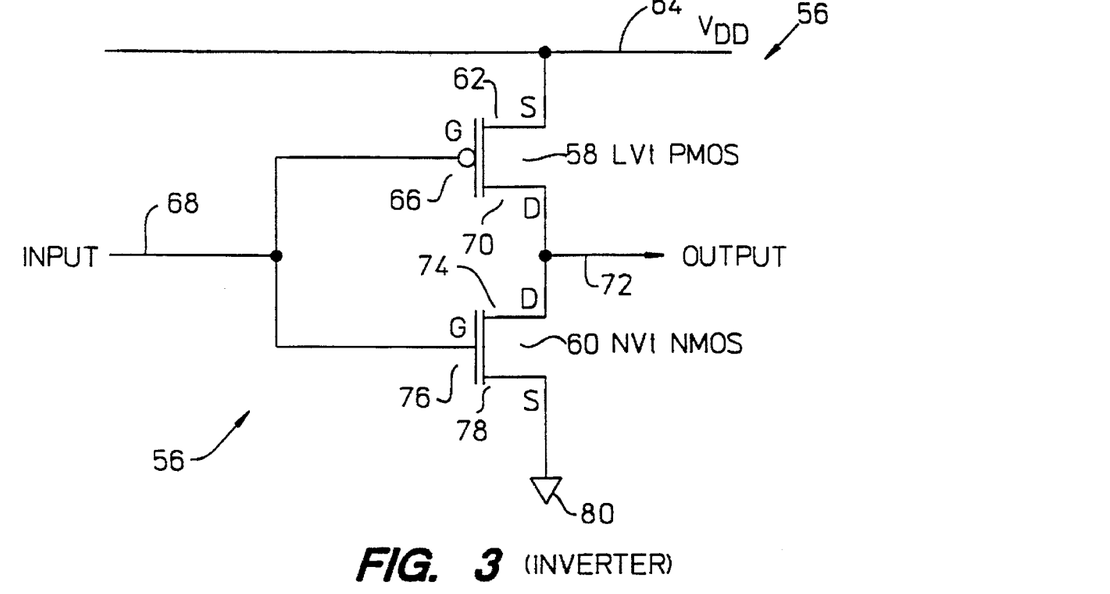
FIG. 3 is a schematic diagram of a CMOS inverter embodying the invention.

FIG. 3 is a schematic diagram of a CMOS inverter 56 embodying the invention. The CMOS inverter 56 includes a low threshold voltage (LVt) PMOS transistor 58 and a normal threshold voltage (NVt) NMOS transistor 60. The LVt PMOS transistor 58 has a source terminal 62 connected to a power terminal 64, a gate terminal 66 connected to an input terminal 68, and a drain terminal 70 connected to an output terminal 72. The NVt NMOS transistor 60 has a drain terminal 74 connected to the output terminal 72, a gate terminal 76 connected to the input terminal 68, and a source terminal 78 connected to a ground terminal 80.

When the input signal on the input terminal 68 is "high", the LVt PMOS transistor 58 is off and the NVt NMOS transistor 60 is on, thereby pulling down the output signal on the output terminal 72 to ground 80. The pull-down performance of the NVt NMOS transistor 60 is the same as with conventional CMOS. Alternatively, when the input signal on the input terminal is "low", the NVt NMOS transistor 60 is off and the LVt PMOS transistor 58 is on, thereby pulling up the, output signal on the output terminal 72 to the power supply voltage using a high drive current.

As shown in FIG. 3, the CMOS inverter 56 is configured in accordance with the first embodiment. However, those skilled in the art will readily recognize that the CMOS inverter 56 can also be configured in accordance with the second embodiment.

Figure 4:
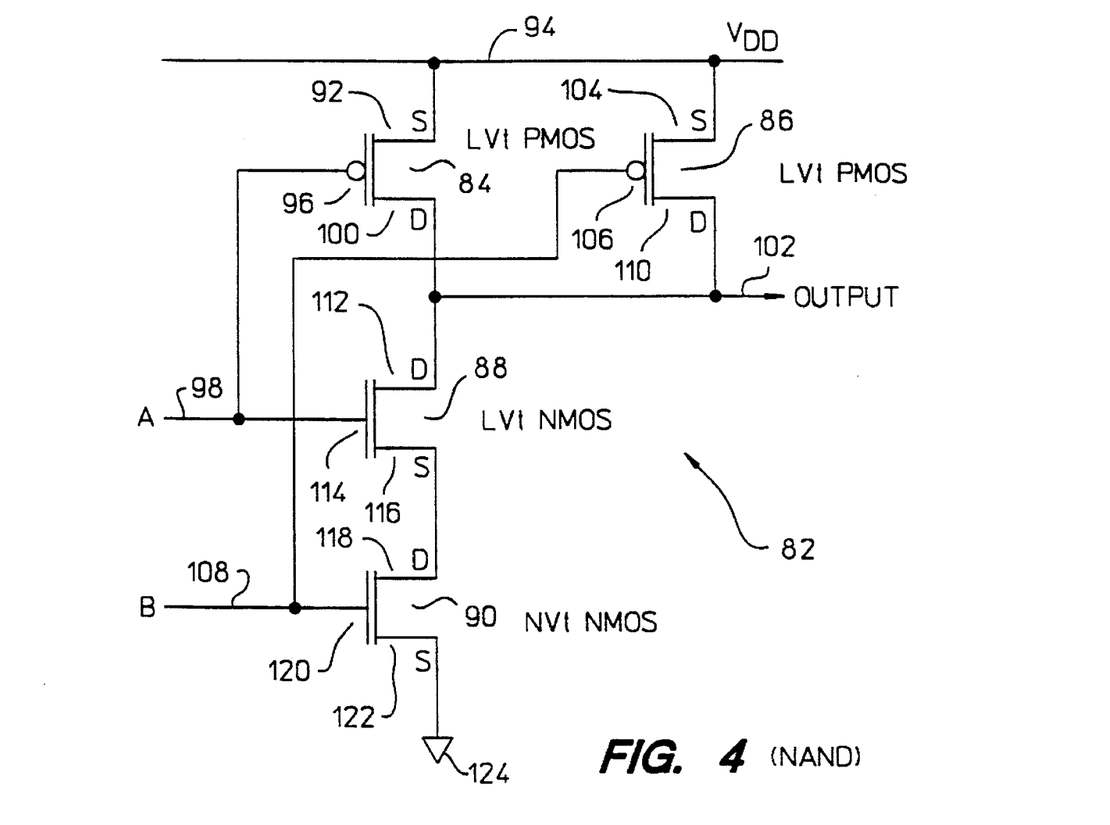
FIG. 4 is a schematic diagram of a CMOS NAND circuit embodying the invention.

FIG. 4 is a schematic diagram of a CMOS NAND circuit 82 embodying the invention. The CMOS NAND circuit 82 includes four transistors 84–90 as does a conventional CMOS NAND circuit, but the threshold voltages of some of the transistors is low to improve the speed performance of the circuit 82. The LVt PMOS transistor 84 has a source terminal 92 connected to a power terminal 94, a gate terminal 96 connected to a first input terminal 98 to receive input signal A, and a drain terminal 100 connected to an output terminal 102. The LVt PMOS transistor 86 has a source terminal 104 connected to the power terminal 94, a gate terminal 106 connected to a second input terminal 108 to receive input signal B, and a drain terminal 110 connected to the output terminal 102. The LVt NMOS transistor 88 has a drain terminal 112 connected to the output terminal 102, a gate terminal 114 connected to the first input terminal 98 to receive the input signal A, and a source terminal 116. The NVt NMOS transistor 90 to has a drain terminal 118 connected to the, source terminal 116 of the LVt NMOS transistor 88, a gate terminal 120 connected to the second input terminal 108 to receive the input signal B, and a source terminal 122 connected to ground 124.

In FIG. 4, PMOS transistors 84, 86 and NMOS transistor 88 are illustrated as being low Vt devices, and NMOS transistor 90 is illustrated as being normal or standard Vt device. The LVt PMOS transistors 84 and 86 operate to pull-up the output signal at high speed. The NMOS transistors 88 and 90 operate to pull-down the output signal.

The CMOS NAND circuit 82 was designed to improve its performance while minimizing power loss. In FIG. 4, PMOS transistors 84 and 86 were selected for low Vt so improve the pull-up speed of the circuit 82. Typically, it will be desired to make the PMOS transistors connected to the output, low Vt, to improve the pull-up switching speed of the circuit 82. On the other hand, since NMOS (for the same magnitude Vt) switches faster the PMOS, it is not necessary to also make the NMOS devices low Vt, even when coupled to the output. However, in the exemplary embodiment of the CMOS NAND circuit 82 shown in FIG. 4, the NMOS transistor 88 is also a low Vt transistor. Using a low Vt NMOS transistor 88 would, for example, be advantageous in cases where the rate of change of input signal A is substantially greater than the rate of change of the input signal B because the speed gain obtained for the pull-down would out weigh the increase in power loss by the NMOS transistor 88.

Hence, according to the invention, the speed performance of CMOS circuits can be improved over that conventionally available (with conventional Vt) by a factor which is believed to be between about 25% to 45%, yet increasing the power loss only to the extend necessary.

Therefore, in designing CMOS circuits low Vt PMOS and low Vt NMOS can be used in speed critical paths, thereby improving the speed performance of the CMOS circuit. Further, in non-critical paths the normal (standard) Vt PMOS and normal (standard) Vt NMOS is used to minimize power loss because normal Vt transistors have less power dissipation that the low Vt transistors.

Figure 5:
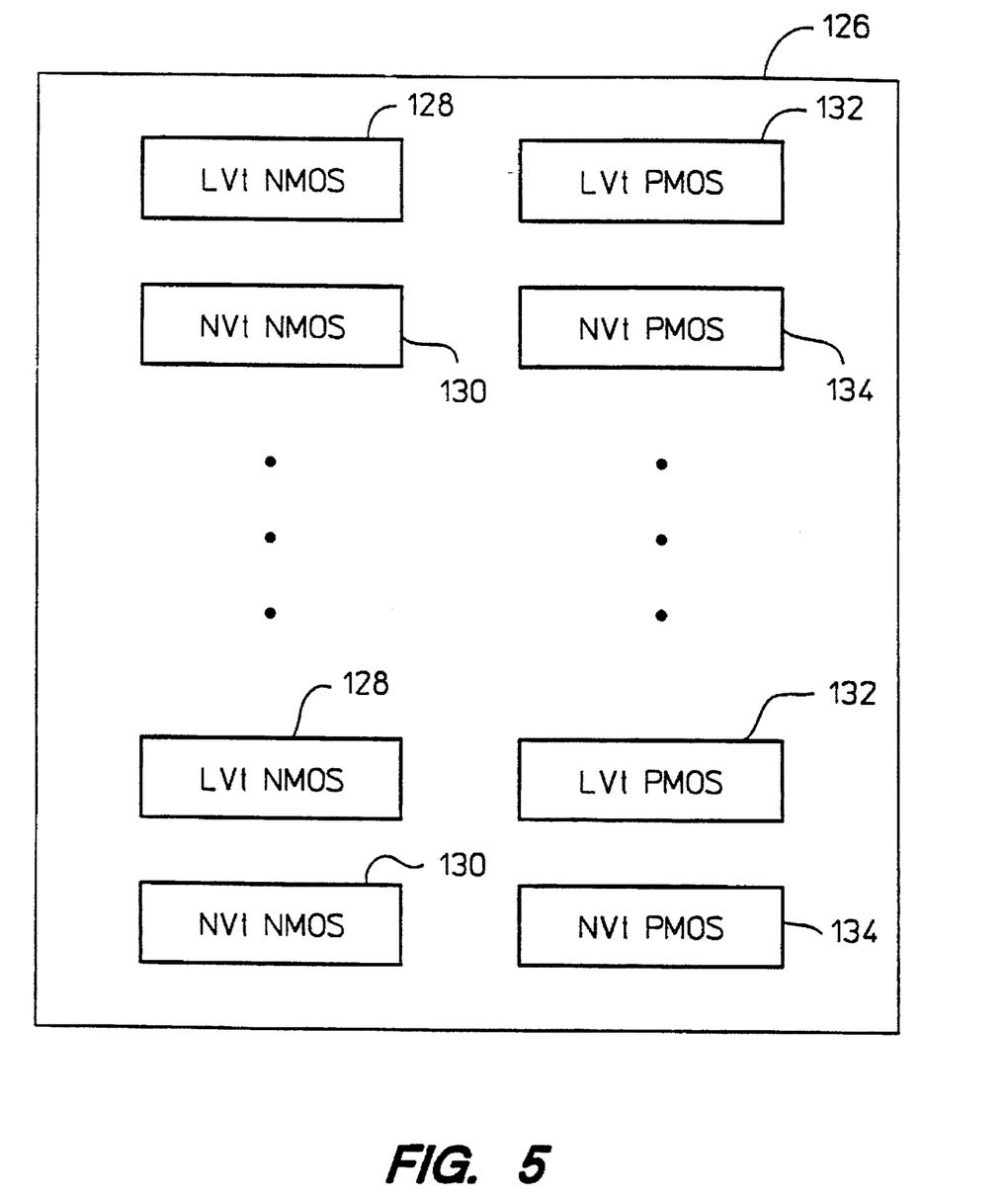
FIG. 5 is a top view of an integrated circuit chip containing low and standard threshold voltage CMOS transistors.

FIG. 5 is a top view of an integrated circuit (IC) chip 126 containing low and standard threshold voltage CMOS transistors which are used to implement a logic circuit. In particular, the chip 126 includes LVT NMOS regions 128, NVt NMOS regions 130, LVt PMOS regions 132, and NVt PMOS regions 134. The IC chip 126 can be an ASIC, a PLA, a gate array, an IC of standard cells, or a standard or custom designed IC. Each of the regions 128–134 includes CMOS technology, namely MOS transistors. The logic circuit formed using the chip 126 would make use of the various regions 128–134 to improve the speed/power dissipation tradeoff. Namely, low Vt transistors or logic devices formed in the LVt NMOS region 128 and/or LVt PMOS region 132 would be used in speed critical paths in place of normal threshold transistors or devices, whereas normal Vt transistors or logic devices formed in the NVt NMOS region 130 and/or NVt PMOS region 134 would be used in non-critical speed paths.

Figure 6:
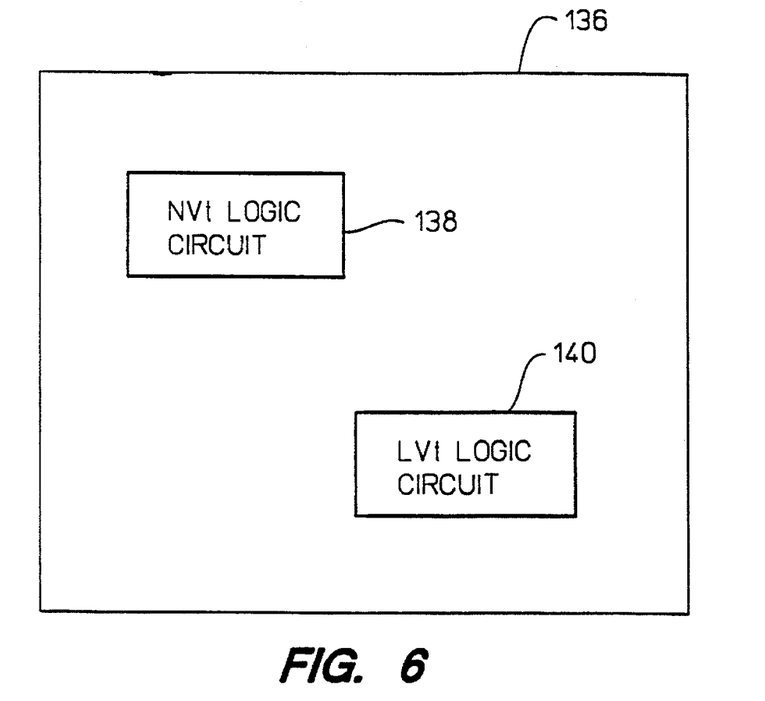
FIG. 6 is a top view of a circuit containing a standard threshold voltage logic circuit and a low threshold voltage logic circuit.
Figure 7:
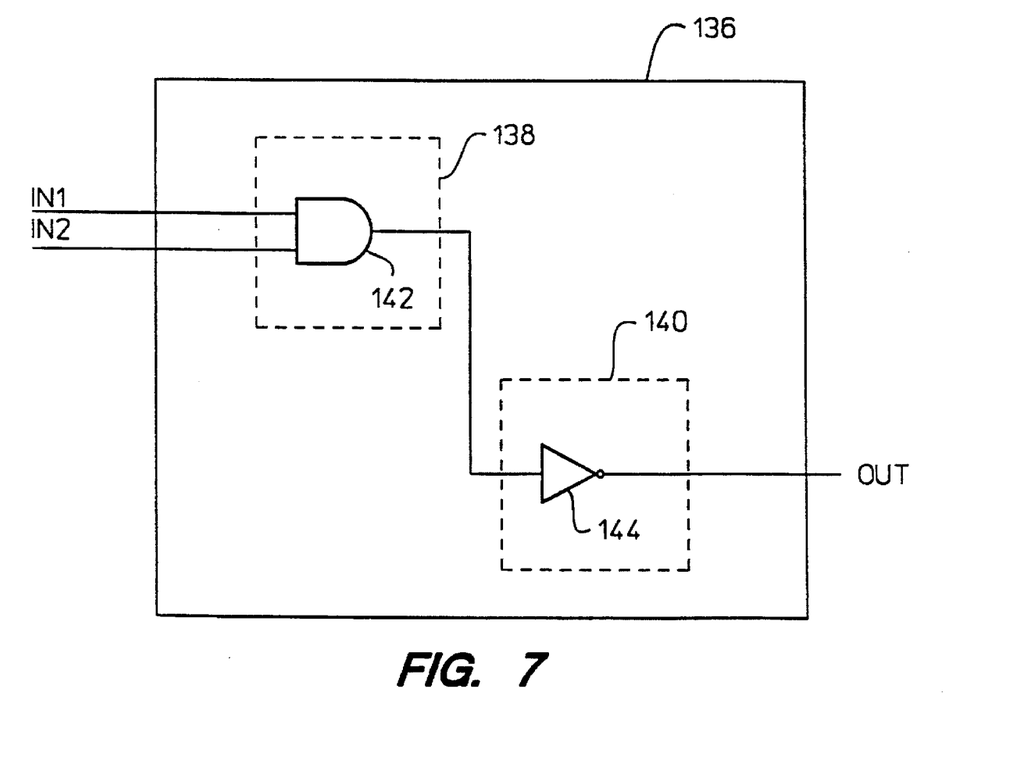
FIG. 7 is a schematic diagram of an exemplary embodiment of the circuit of FIG. 6.

FIG. 6 is a top view of a circuit 136 containing a normal threshold voltage (NVt) logic circuit 138 and a low threshold voltage (LVt) logic circuit 140. The circuit 136 is implemented using both the low Vt logic circuit 138 and the normal Vt logic circuit 140. The logic circuits 138–140 contain one or more logic devices (AND, OR, NOR, inverter, etc.). FIG. 7 is a schematic diagram of an exemplary embodiment of the circuit 136 of FIG. 6. In FIG. 7, the NVt logic circuit 138 includes an AND gate 142, and the LVt logic circuit 140 includes an inverter 144. As shown, the circuit 136 receives input signals IN1 and IN2 at the input terminals of the AND gate 142, forwards the result to the input terminal of the inverter 144, and outputs the final result as an output signal (OUT).

The mixture of the NVt and LVt logic circuits enables the circuit 136 to improve speed performance of the circuit 136 where needed, while at the same time minimizing the power dissipation. By selectively using normal voltage thresholds in circuit 138 and low voltage thresholds in circuit 140, speed performance can be improved where needed without unnecessarily increasing power dissipation.

Figure 8:
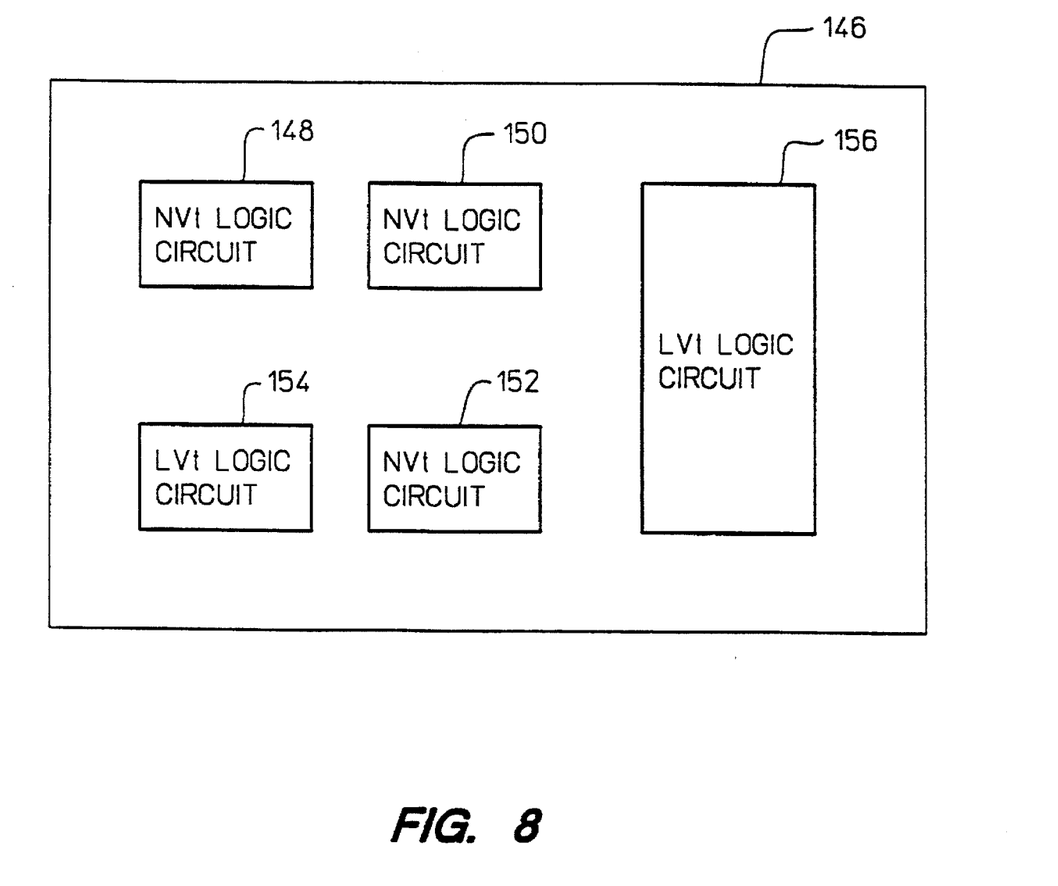
FIG. 8 is a top view of a circuit containing logic circuits having either standard threshold voltages or low threshold voltages.

FIG. 8 is a top view of a complex circuit 146 containing a plurality of logic circuits having either a normal threshold voltage or a low threshold voltage. As illustrated, the complex circuit 146 includes a first NVt logic circuit 148, a second NVt logic circuit 150, a third NVt logic circuit 152, a first LVt logic circuit 154, and a second LVt logic circuit 156. The selective introduction of LVt logic circuits 154, 156 into the design of the complex circuit 146 operates to improve the speed performance of the complex circuit 146 without substantially increasing power dissipation.

Figure 9:
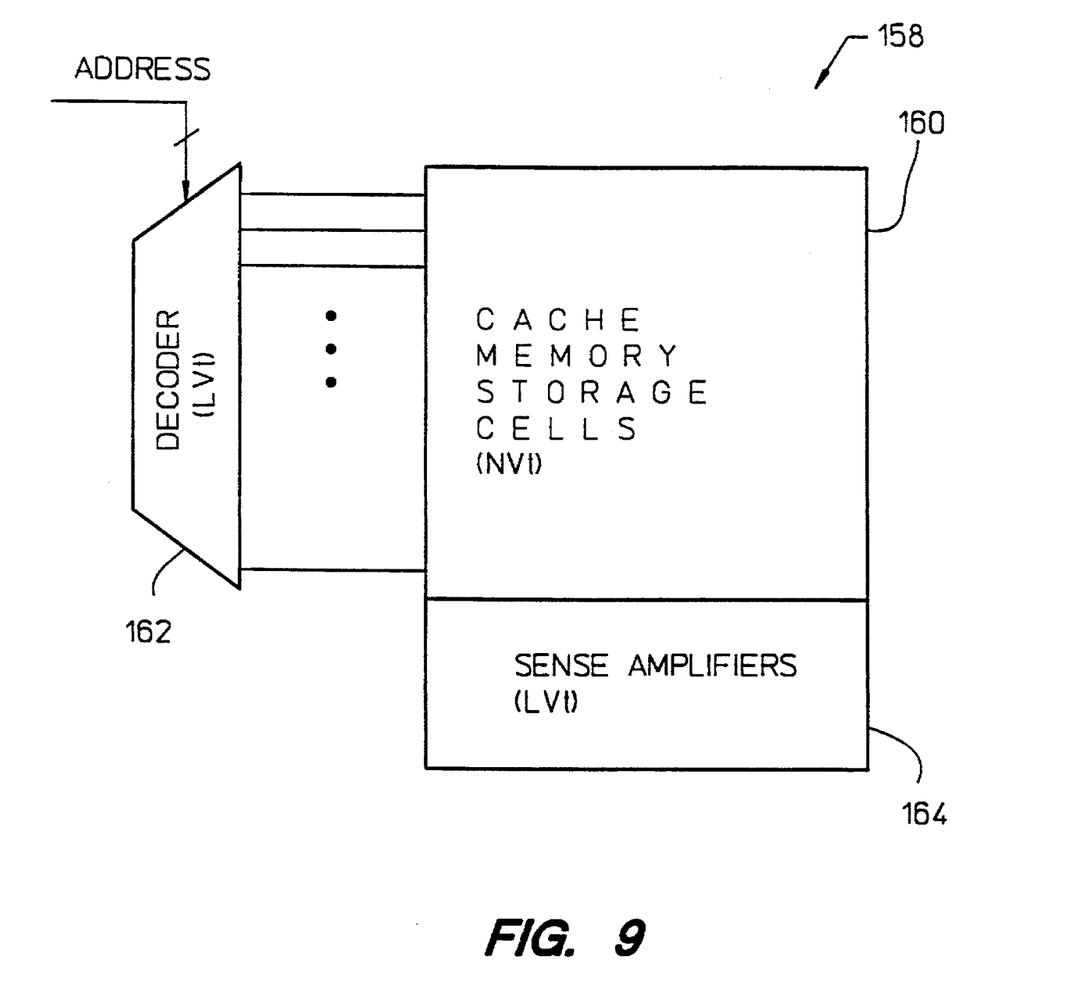
FIG. 9 is a block diagram of a high-speed cache memory embodying the invention.
Figure 10:
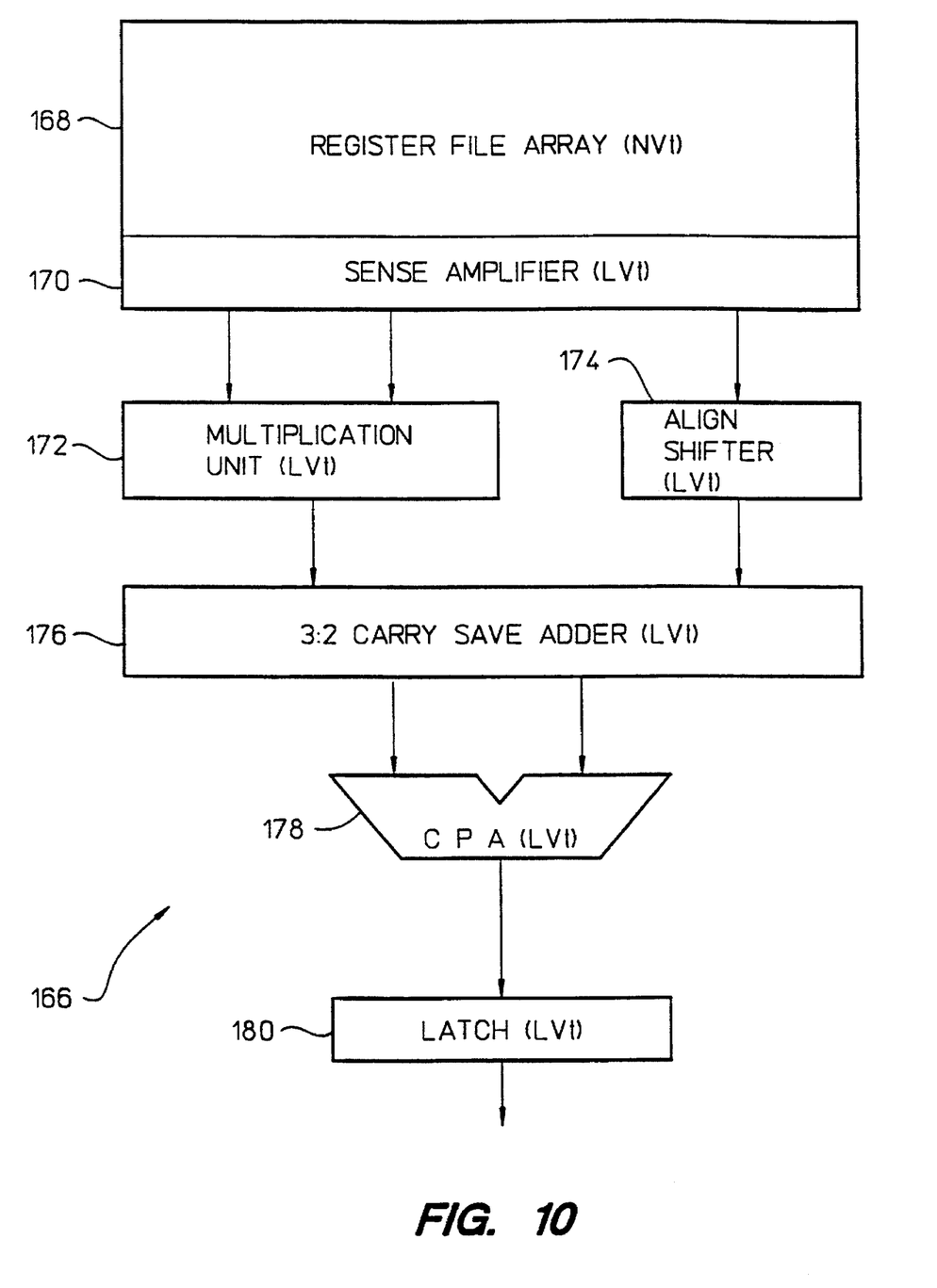
FIG. 10 is a block diagram of a floating-point arithmetic unit designed with both low threshold voltage circuits and standard threshold voltage circuits.

Examples of two common circuits designed with both normal and low voltage threshold logic circuits are provided in FIGS. 9 and 10.

FIG. 9 is a block diagram of a high-speed cache memory 158 embodying the invention. The cache memory 158 includes an array of cache memory storage cells 160, an address decoder 162, and a plurality of sense amplifiers 164. In accordance with the invention, the speed of the cache memory 158 is improved by using low Vt CMOS transistors in the address decoder 162 and the sense amplifiers 164. By providing the address decoder 162 and the sense amplifiers 164 with low Vt CMOS transistors, only several hundred to a few thousand transistors are low Vt. In contrast, the many hundreds of thousand transistors of the memory storage cells 160 are kept at normal Vt because their speed is less critical than for the decoder 162 or sense amplifiers 164 and because to make the memory cells 160 low Vt would result in substantial power dissipation. Hence, the speed of the memory cells 160 is not critical enough to warrant the increase in power dissipation and, in addition, leakage current must be kept low in memory arrays.

FIG. 10 is a block diagram of a floating-point arithmetic unit 166 designed with both low threshold voltage circuits and normal threshold voltage circuits. The floating-point arithmetic unit 166 includes a register file array 168, sense amplifiers 170, a multiplication unit 172, an align shifter 174, a 3:2 carry save adder 176, a carry propagate adder 178 and a latch 180. In the design shown in FIG. 10, the sense amplifiers 170, the multiplication unit 172, the align shifter 174, the carry save adder 176, the carry propagate adder 178 and the latch 180 are all implemented using low Vt to increase the speed on the arithmetic unit 166, and the register file array 168 is implemented in normal Vt because its speed is not as critical. The basic operation of such an arithmetic unit 166 follows that of the arithmetic unit disclosed in U.S. Pat. No. 4,999,802.

Hence, when designing a circuit using CMOS technology, one can select whether the pieces or parts of the design should be implemented in normal Vt or low Vt. For example, if a computer-aided-design (CAD) system is used in designing the circuit, the user simply selects not only the logic devices (e.g., OR gate, NOR gate, AND gate, NAND gate, inverter, buffer, tri-state gate, or the like) to be used but also the threshold voltage to be used in the logic devices (see FIG. 11 discussed below). Namely, the voltage threshold to be used can be normal Vt or low Vt. The low Vt is selected for the most speed critical paths to the extent practical given that low Vt increases power dissipation. For example, if speed is critical in a certain portion of the circuit, a LVt logic device is used, whereas in another portion of the circuit where speed is not critical, a NVt logic device is used.

In the above embodiments, when a power supply voltage (which is coupled to the CMOS circuit) is equal or above about 2 volts, the low threshold voltage of the MOS transistors is within the range of about 0.1–0.3 volts and the standard (or normal) threshold voltage of the MOS transistors is within the range of about 0.4–1.0 volts. On the other hand, when the supply voltage is below about 2 volts, the standard threshold of the MOS transistors is within the range of about 0.1–0.2 volts which is already relatively low; hence, the altered threshold is increased (instead of lowered) to about 0.3–0.4 volts. In this low voltage operation, the speed/power dissipation is controlled by using the higher threshold voltage MOS transistors where slower speed can be tolerated, thereby decreasing power dissipation of the CMOS circuit.

Although the above discussion of the invention describes static CMOS circuits, the invention is equally applicable to dynamic CMOS circuits as well as quasi-static CMOS circuits.

Figure 11:
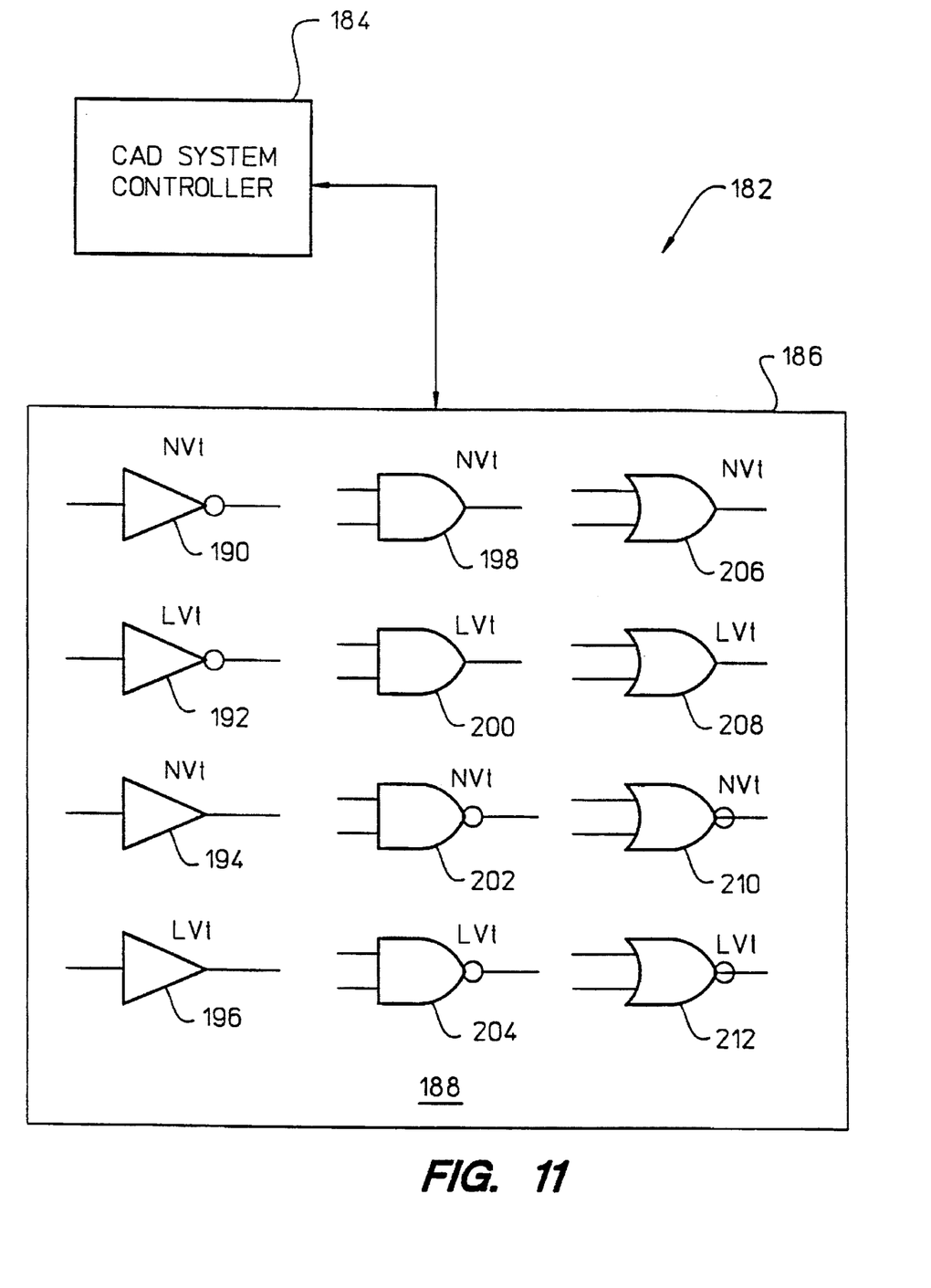
FIG. 11 is a block diagram of a computer-aided design (CAD) system embodying the invention.

The invention can also be implemented as a method for design of CMOS logic circuits. FIG. 11 is a block diagram of a CAD system 182 embodying the invention. The CAD design system includes a CAD system controller 184 and a display screen 186.

Initially, the method would begin by identifying a logic element for forming a portion of the circuit. The portion of the circuit could represent a single transistor or a standard logic device. Next, the method determines whether the logic element identified is within a speed critical path in the logic circuit being designed. If it is, then a low threshold voltage construction of the logic element is selected. Typically, the designer would select the low threshold construction from a menu 188 of logic devices 190–212 produced on the display screen 188 by the CAD system controller 184. For example, if a NAND gate is the identified logic function desired and its determined to be in a speed critical path, then the designer can choose from a low Vt construction 204 and a normal Vt construction 202. In other situations, the designer might want to choose a partially low Vt such as illustrated in FIG. 4. On the other hand, when the logic element is not within a speed critical path in the logic circuit being designed, then a normal threshold voltage construction of the logic element is selected. In other situations, the designer might want to choose a high Vt instead of the normal Vt, for example when the normal Vt is already low (e.g., low power supply voltage situation). Thereafter, for all other portions of the logic circuit being designed, the above process is repeated for each of the other logic elements forming the remaining portions of the circuit.

FIG. 12 is a chart illustrating the performance advantage of the invention. The horizontal axis represents load capacitance and the vertical axis represents gate delay. FIG. 12, discussed below, is a graph illustrating the performance of the invention (referred to as ACMOS represents adaptive CMOS) in comparison to regular CMOS and BiNMOS. As illustrated, although not quite as fast as BiNMOS above about 0.2 pf, the invention (ACMOS) has a reduced gate delay of about 25% to 45% in contrast to regular CMOS. Furthermore, the invention (ACMOS) is actually faster (i.e., lower gate delay) than BiNMOS at load capacitances less than about 0.2 pf.

The many features and advantages of the present invention are apparent from the written description and thus it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A CMOS circuit operatively connectable to first and second potentials, comprising:
   a PMOS transistor having a threshold voltage, said PMOS transistor having a source terminal operatively connected to the first potential, a gate terminal for receiving a first input signal, and a drain terminal operatively connected to an output terminal; and
   a first and a second NMOS transistor, said first NMOS transistor having a source terminal operatively connected to the second potential, a gate terminal for receiving a second input signal, and a drain terminal, and said second NMOS transistor having a source terminal connected to said drain terminal of said first NMOS transistor, a gate terminal connected to receive said first input signal, and a drain terminal connected said output terminal;
   wherein the threshold voltage of one of said NMOS transistors is a standard threshold voltage and the threshold voltage of the other NMOS transistor is lower than the standard threshold voltage, and wherein the threshold voltages are made different so as to optimize speed of said CMOS circuit while minimizing leakage current,
   wherein the first potential is a supply potential and the second potential is a ground potential, and
   wherein the lower threshold voltage is about 5% of the first potential.

2. A CMOS circuit as recited in claim 1, wherein the standard threshold voltage is about 15% of the supply potential.

3. A CMOS circuit operatively connectable to first and second potentials, comprising:
   a PMOS transistor having a threshold voltage, said PMOS transistor having a source terminal operatively connected to the first potential, a gate terminal for receiving a first input signal, and a drain terminal operatively connected to an output terminal; and
   a first and a second NMOS transistor, said first NMOS transistor having a source terminal operatively connected to the second potential, a gate terminal for receiving a second input signal, and a drain terminal, and said second NMOS transistor having a source terminal connected to said drain terminal of said first NMOS transistor, a gate terminal connected to receive said first input signal, and a drain terminal connected said output terminal;
   wherein the threshold voltage of one of said NMOS transistors is a standard threshold voltage and the threshold voltage of the other NMOS transistor is lower than the standard threshold voltage, and wherein the threshold voltages are made different so as to optimize speed of said CMOS circuit while minimizing leakage current,
   wherein the first potential is a supply potential which ranges from 2.5 volts to 6 volts and the second potential is a ground potential, and
   wherein the lower threshold voltage is within the range of 0.1–0.3 volts.

4. A CMOS circuit as recited in claim 3, wherein the standard threshold voltage is normal and within the range of 0.4–1.0 volts.

5. A CMOS circuit operatively connectable to first and second potentials, comprising:
   a PMOS transistor having a threshold voltage, said PMOS transistor having a source terminal operatively connected to the first potential, a gate terminal for receiving a first input signal, and a drain terminal operatively connected to an output terminal; and
   a first and a second NMOS transistor, said first NMOS transistor having a source terminal operatively connected to the second potential, a gate terminal for receiving a second input signal, and a drain terminal, and said second NMOS transistor having a source terminal connected to said drain terminal of said first NMOS transistor, a gate terminal connected to receive said first input signal, and a drain terminal connected said output terminal;
   wherein the threshold voltage of one of said NMOS transistors is a standard threshold voltage and the threshold voltage of the other NMOS transistor is lower than the standard threshold voltage, and wherein the threshold voltages are made different so as to optimize speed of said CMOS circuit while minimizing leakage current,
   wherein the first potential is a supply potential of about 3.3 volts and the second potential is a ground potential, and
   wherein the lower threshold voltage is within the range of 0.1–0.3 volts and the standard threshold voltage is within the range of 0.45–0.6 volts.

6. A CMOS circuit operatively connectable to first and second potentials, comprising:
   a PMOS transistor having a threshold voltage, said PMOS transistor having a source terminal operatively connected to the first potential, a gate terminal for receiving a first input signal, and a drain terminal operatively connected to an output terminal; and
   a first and a second NMOS transistor, said first NMOS transistor having a source terminal operatively connected to the second potential, a gate terminal for receiving a second input signal, and a drain terminal, and said second NMOS transistor having a source terminal connected to said drain terminal of said first NMOS transistor, a gate terminal connected to receive said first input signal, and a drain terminal connected said output terminal;
   wherein the threshold voltage of one of said NMOS transistors is a standard threshold voltage and the threshold voltage of the other NMOS transistor is lower than the standard threshold voltage, and wherein the threshold voltages are made different so as to optimize speed of said CMOS circuit while minimizing leakage current, wherein the first potential is a supply potential of about 5 volts and the second potential is a ground potential, and wherein the lower threshold voltage is within the range of 0.1–0.3 volts and the standard threshold voltage is within the range of 0.6–1.0 volts.

7. A logic device comprising:

a NAND gate having:
- a first transistor having a first source terminal, a first drain terminal, and a first gate terminal, wherein said first transistor is a PMOS transistor;
- a second transistor having a second source terminal, a second drain terminal, and a second gate terminal, wherein said second transistor is an NMOS transistor;
- a third transistor having a third source terminal, a third drain terminal, and a third gate terminal, wherein said third transistor is a PMOS transistor; and
- a fourth transistor having a fourth source terminal, a fourth drain terminal, and a fourth gate terminal, wherein said fourth transistor is an NMOS transistor;

wherein said first and third source terminals are connected to a first potential;

wherein said first, third, and fourth drain terminals are connected to an output terminal;

wherein said first and fourth gate terminals are connected to a first input terminal;

wherein said second drain terminal is connected to said fourth source terminal;

wherein said second source terminal is connected to a second potential;

wherein said second and third gate terminals are connected to a second input terminal; and wherein said second transistor operate at a different threshold voltage than said fourth transistor.

8. The logic device of claim 7 wherein said first, third, and fourth transistors operate at a lower threshold voltage than said second transistor.

* * * * *